United States Patent [19]

Korsunsky

[11] Patent Number: 4,710,134
[45] Date of Patent: Dec. 1, 1987

[54] LOW INSERTION FORCE CHIP CARRIER CONNECTOR WITH MOVABLE HOUSING

[75] Inventor: Iosif Korsunsky, Harrisburg, Pa.

[73] Assignee: AMP Incorporated, Harrisburg, Pa.

[21] Appl. No.: 913,056

[22] Filed: Sep. 29, 1986

[51] Int. Cl.[4] .............................................. H01R 9/09
[52] U.S. Cl. ..................................... 439/264; 439/70
[58] Field of Search ............. 339/17 CF, 74 R, 75 M, 339/75 MP; 439/76, 263, 264, 265, 70

[56] References Cited

U.S. PATENT DOCUMENTS

| | | | |
|---|---|---|---|
| 3,474,387 | 10/1969 | Krum et al. | 339/75 |
| 3,753,211 | 8/1973 | Pauza et al. | 339/75 MP |
| 3,883,207 | 5/1975 | Tomkiewicz | 339/75 M |
| 4,349,238 | 9/1982 | Showman et al. | 339/75 M |
| 4,420,207 | 12/1983 | Nishikawa | 339/17 CF |
| 4,470,650 | 9/1984 | Lundergan | 339/17 CF |
| 4,491,378 | 1/1985 | Crawford | 339/17 CF |
| 4,630,875 | 12/1986 | Korsunsky et al. | 339/17 CF |
| 4,645,279 | 2/1987 | Grabbe et al. | 339/17 CF |

Primary Examiner—J. Patrick McQuade
Attorney, Agent, or Firm—Bruce J. Wolstoncroft

[57] ABSTRACT

Chip carrier connector comprises a housing having a base and walls extending normally therefrom. The housing is movable relative to terminals between a first position and a second position. When the housing is moved to the second position, the terminals are moved inwardly thereby pressing the contact portions of the terminals against contact pads on the chip carrier. As this occurs, the terminals provide a wiping action on the contact pad to ensure that positive electrical contact is effected. The housing may also cam the terminals outwardly to permit placement of the chip carrier in the recess under zero insertion force conditions.

20 Claims, 4 Drawing Figures

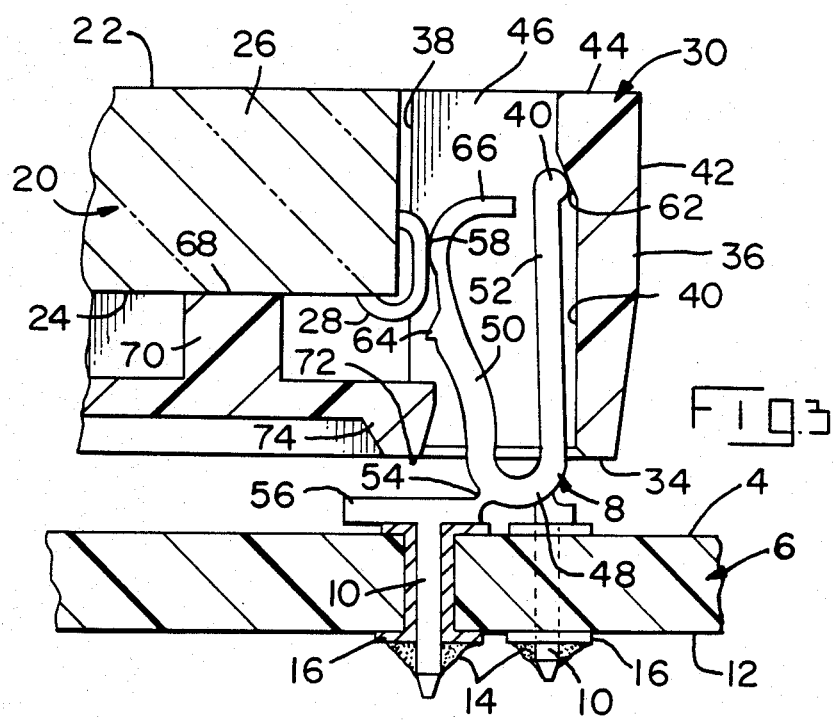
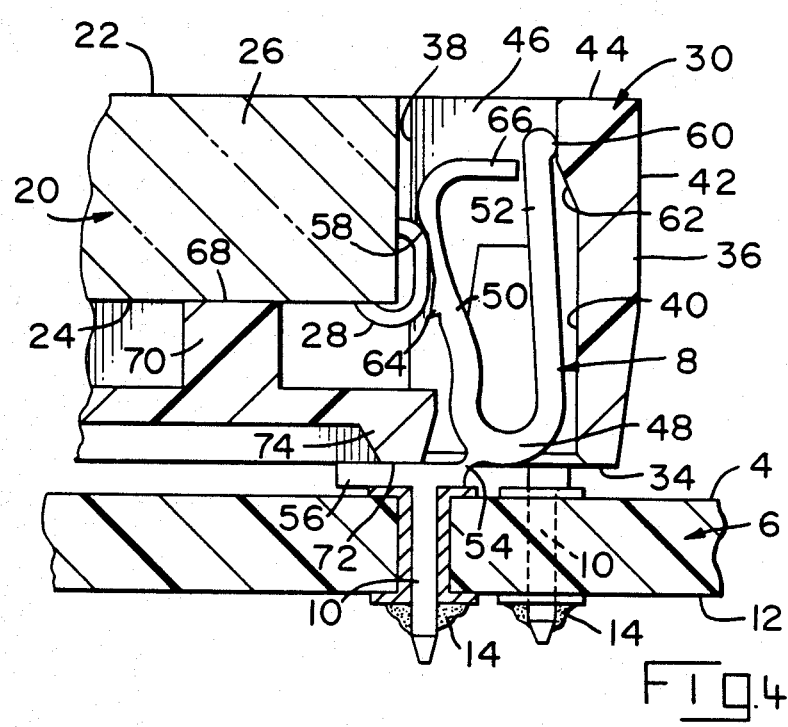

a# LOW INSERTION FORCE CHIP CARRIER CONNECTOR WITH MOVABLE HOUSING

FIELD OF THE INVENTION

This invention relates to chip carrier connectors or connectors of the type which are adapted to receive a rectangular chip carrier having contact pads on its sides. The connector has contacts which engage the contact pads, connecting the pads to conductors on a circuit board or the like. More particularly, this invention is directed to a chip carrier connector having a movable housing which allows the chip carrier to be inserted under low insertion force and which provides a wiping action as insertion occurs.

BACKGROUND OF THE INVENTION

A standard type of housing or carrier for an integrated circuit chip comprises a rectangular body of insulating material having outwardly facing chip carrier side surfaces on which there are provided contact pads or leads which extend from conductors which in turn extend from the integrated circuit chip contained in the chip carrier. When the chip carrier is tested prior to its being placed in service, it is placed in a chip carrier connector temporarily while "burn-in" and tests are carried out. Chip carrier connectors of this type are commonly referred to as "burn-in" connectors because chip carriers having integrated circuits thereon are usually tested at elevated temperatures before being placed in service. After the chip carrier has been tested, it is placed permanently in a chip carrier connector on a circuit board or the like.

A known type of chip carrier connector comprises a housing of insulating material having a recess therein which receives the chip carrier. The housing has contact terminals therein which engage or contact the contact pads on the chip carrier when the chip carrier is placed in the recess. The contact force with which each of the contact terminals engages the contact pads on the chip carrier in an important consideration. This contact force is relatively low if the contact surfaces are all plated with gold; however, it must be higher if the surfaces are tin plated. In either event, it is important that this contact force be closely controlled in the connector in which the chip carrier is used. The higher the contact force required, the greater the insertion force required for insertion of the chip carrier into the recess of the housing. In order to avoid this problem of high insertion force, chip carrier connectors have been designed to allow for low insertion force while still providing the required contact force to make electrical connection with the conductive areas on the circuit board.

In an effort to provide a chip carrier connector having zero or low insertion force characteristics and a means to closely control the contact force exerted by the contact terminals of the chip carrier connector on the contact pad surfaces or the contact leads of the chip carrier, the multipart chip carrier connector disclosed in U.S. patent application Ser. No. 814,511, filed Dec. 18, 1985, and now U.S. Pat. No. 4,630,875, was produced. This chip carrier connector has a frame outside the housing which cooperates with the terminals such that only low insertion force is required to place the chip carrier in the chip carrier recess. At the same time, it provides a predetermined contact force after the chip carrier is placed in the connector. The chip carrier connector of this type is particularly desirable in "burn-in" type connector applications because of the fact that the connector is used repeatedly in burn-in and in testing newly-manufactured chip carriers. The problem with this type of connector is that the chip carrier requires a special frame for operation which is costly to manufacture and occupies a relatively large space.

SUMMARY OF THE INVENTION

The invention comprises a chip carrier connector for an integrated circuit chip carrier, the chip carrier being of the type comprising a rectangular chip carrier body having oppositely facing major surfaces and outwardly facing chip carrier side surfaces. The chip carrier side surfaces have spaced-apart leads thereon which are between the major surfaces. The chip carrier connector comprises a housing having a recess therein which is dimensioned to receive the chip carrier. The housing has a base having chip carrier connector walls extending normally therefrom. The walls define the recess for the chip carrier, each wall having an internal surface which is opposed to the chip carrier side surface when a chip carrier is placed in the recess. The internal surfaces of the walls have camming surfaces located thereon, each wall having terminal-receiving cavities extending inwardly thereof from its internal surface. Electrical terminals are positioned in the terminal-receiving cavities, the terminals being movable such that contact portions of the terminals are located in the cavities when the housing is in a first position and in the recess when the housing is in a second position.

The housing is movable, whereby as the chip carrier is inserted into the recess, the housing is positioned in the first position with the terminals completely in the cavities to allow for low insertion force of the carrier into the recess of the housing; as insertion continues, the chip carrier contacts a section of the housing causing the chip carrier and the housing to move to the second position. The second position is defined when a bottom surface of the housing engages a circuit board. As the housing is moved between the first and second position, the camming surfaces of the walls cooperate with the terminals to move the terminals against contact pads of the chip carrier, causing the terminals to create a wiping action on the contact pads, ensuring that the contact pads and the terminals make positive electrical contact with each other and the chip carrier is maintained in position in the connector.

An object of the invention is to provide a chip carrier connector which allows the chip carrier to be inserted under low insertion force conditions, but still provides the contact force required to hold the chip carrier in place and ensure positive electrical contact between the contact pads of the chip carrier and the terminals of the chip carrier connector.

Another object of the invention is to provide a chip carrier connector which will also produce a wiping action of the terminals on the contact pads under normal force conditions.

A further object of the invention is to provide the above-mentioned objectives in a simple housing which can be easily and cheaply manufactured and which will facilitate robotic handling thereof.

BRIEF DESCRIPTION OF THE DRAWINGS

FIG. 3 is a view similar to that of FIG. 2 showing an intermediate position of the chip carrier and the chip carrier connector.

FIG. 4 is a view similar to that of FIG. 2 showing the position of the parts after the chip carrier has been placed in the recess of the chip carrier connector and after the chip carrier and the chip carrier connector have been moved to a second position.

DETAILED DESCRIPTION OF THE INVENTION

Figures 1, 2:
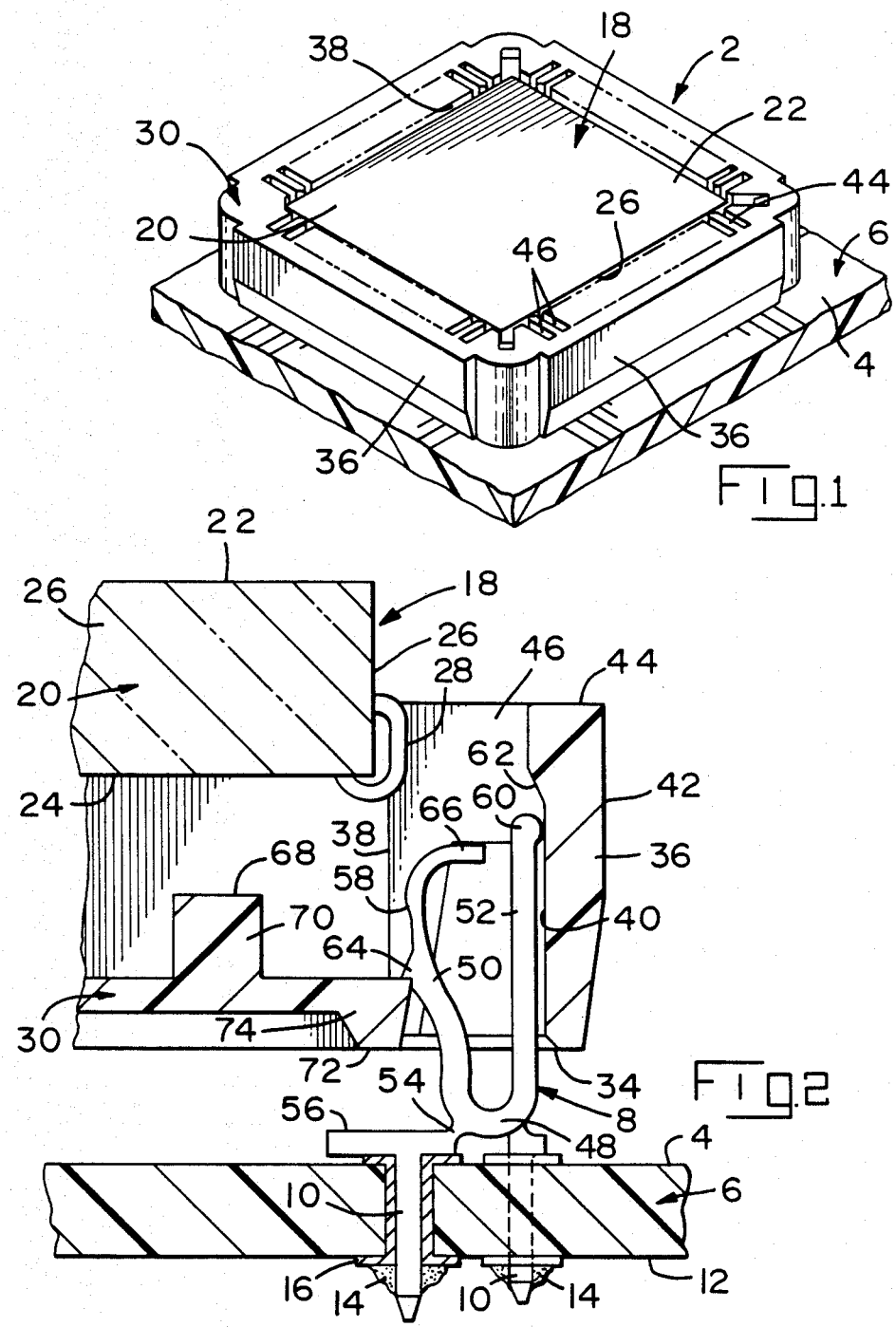
FIG. 1 is a perspective view of a chip carrier connector in accordance with the invention mounted on a circuit board with a chip carrier in a recess of the connector.
FIG. 2 is a partial cross-sectional view showing the position of the parts when the connector is in a first position, prior to placement of the chip carrier in the recess of the chip carrier connector.

FIG. 1 shows a chip carrier connector 2 in accordance with the invention mounted on an upper surface 4 of a circuit board 6. Electrical terminals 8 in connector 2 have post portions 10 which extend along plated-through holes of circuit board 6 to the underside 12 thereof and are soldered as shown at 14 (FIGS. 2 through 4) to conductors 16 on the underside 12 of board 6, placing conductors 16 in electrical contact with terminals 8. Under some circumstances, terminals 8 may be soldered directly to conductors (not shown) on upper surface 4 of circuit board 6 as in surface mounted versions.

Connector 2 has contained therein a chip carrier 18 which comprises a square chip carrier body 20 having upper surface 22 and lower surface 24 and outwardly facing chip carrier side surfaces 26. Contact pads 28 are provided on the side surfaces 26, these contact pads 28 being the leads which extend from an integrated chip contained in the chip carrier 18. One end of chip carrier body 20 may be beveled to facilitate correct placement of chip carrier 18 in connector 2.

Chip carrier connector 2 comprises a housing 30 and terminals 8 located therein. Housing 30 is of a suitable insulating material, is produced by molding techniques, and comprises a rectangular base 34 having walls 36 extending normally therefrom. Walls 36 and base 34 define a recess 38 into which chip carrier 18 is inserted.

Each wall 36 has an internal surface 40, an external surface 42, and an upper end 44. Terminal-receiving cavities 46 extend inwardly from internal surface 40, each cavity 46 containing a respective electrical terminal 8. Each terminal 8 has a bight portion 48, arms 50,52 extending from bight portion 48, a neck 54 which extends from portion 48 to a base 56, and post 10 which extends from base 56 for insertion in plated-through holes in circuit board 6. A contact surface portion 58 of each terminal 8, which engages a respective contact pad 28 on the side surface 26 of chip carrier 18, is located on the front arm 50 as shown in FIG. 2.

Each back arm 52 is essentially straight with a widened arcuate end 60 located away from bight portion 48. This arcuate surface 60 acts as a cam follower, cooperating with a camming surface 62 of walls 36 of housing 30 as it is moved between a first and a second position, as will be discussed hereafter. Each front arm 50 extends from portion 48 and curves such that front arm 50 and portion 48 form a generally C-shaped member. In the middle of front arm 50, a projection 64 is located which faces away from back arm 52 toward chip carrier 18. This projection 64 retains terminals 8 in housing 30 when housing 30 is in the first position as shown in FIG. 2 prior to connector 2 being mounted on board 6.

The shape of front arm 50 below projection 64 is designed to allow terminals 8 to be preloaded when housing 30 is in the first position. Section 74 of housing 30 causes terminals 8 to move toward walls 36 when housing 30 is in the first position, ensuring that front arms 50 are clear of recess 38, thereby preventing terminals 8 from exerting force on the chip carrier 18 as chip carrier 18 is inserted into the recess 38 of the chip carrier housing 30. Moreover, terminals 8 can be maintained in terminal-receiving cavities 46 by section 74 engaging projections 64 of front arms 50 thereby enabling connector 2 to be placed in position on a circuit board with posts 10 positioned in respective plated-through holes of the board.

Another important feature of the front arm 50 is the configuration of its upper portion. The upper portion is bent toward back arm 52 such that an end section 66 of front arm 50 is proximate back arm 52 and essentially perpendicular thereto. This configuration prevents front arm 50 from taking a permanent set. As only a small space is provided between end section 66 and back arm 52, improper insertion of the chip carrier 18 into recess 38 will deform front arm 50 only a minimal distance d, as end section 66 engages back arm 52, defining a stop position. Thus, as front arm 50 is prevented from overstress, its resilient characteristics are maintained.

Chip carrier housing 30 is movable between the first or raised position as shown in FIG. 2 to a second or lowered position as shown in FIG. 4. Walls 36 of housing 30 have internal surfaces 40 which in turn have inclined camming surfaces 62 adjacent to the upper end 44 of walls 36 of housing 30. These inclined camming surfaces 62 cooperate with the arcuate ends 60 of back arms 52 of terminals 8 to cam terminals 8 inwardly when housing 30 is moved downwardly from the first position to the second position. Arcuate ends 60 of terminals 8 thus function as cam followers, as was previously mentioned.

In operation, chip carrier 18 is inserted into recess 38 when housing 30 is in the first position. In this first position (FIG. 2) section 74 of housing 30 places terminals 8 in a prestressed condition and consequently chip carrier 18 does not contact terminals 8 as chip carrier 18 is placed in recess 38, thereby allowing insertion of chip carrier 18 into recess 38 under zero insertion force. Insertion of the chip carrier 18 into recess 38 is complete when lower major surface 24 of chip carrier 18 engages a top surface 68 of a projection 70 of housing 30.

With chip carrier 18 now seated in recess 38, downward force is applied to chip carrier 18. This causes chip carrier 18 and housing 30 to move as a single unit toward circuit board 6. As housing 30 and chip carrier 18 are moved vertically, terminals 8 remain fixed in the vertical direction. This movement of the chip carrier 18 and housing 30 relative to terminals 8 enables terminals 8 to make positive electrical contact with chip carrier 18, as will be discussed.

As housing 30 is moved downward from the first position to the second position, FIG. 2 to FIG. 4, arcuate ends 60 of terminals 8 and camming surfaces 62 of housing 30 cooperate to pivot arms 50,52 and bight portions 48 of terminals 8 inward about necks 54 toward chip carrier 18 such that contact portions 58 of terminals 8 are urged against contact pads 28 of chip carrier 18 with a precisely determined force. Due to the configuration of arcuate ends 60 and camming surfaces 62, contact portions 58 of terminals 8 engage contact pads 28 on chip carrier 18 before chip carrier 18 and housing 30 have reached the second position. This is illustrated in FIG. 3. Thus, after contact is made and as the downward motion of chip carrier 18 and housing 30 continues, contact portions 58 and contact pads 28 cooperate to cause a wiping action. This is a positive wipe action performed under normal force conditions to ensure that terminals 8 are in positive electrical connection with the chip carrier 18 when the insertion is completed. As should be noted from the drawings (FIGS. 3 and 4), if properly designed, contact portions 58 should only have a small section in engagement with contact pads 28. The insertion process is complete when bottom surfaces 72 of bottom projections 74 engage bases 56 of terminals 8, preventing the chip carrier 18 and housing 30 from further downward movement, defining the second position.

The contact pressure of terminals 8 against contact pads 28, in the second position, is great enough to maintain chip carrier 18 in recess 38 of housing 30. In this second position, there is no possibility of terminals 8 releasing chip carrier 18 since the housing 30 is rigid and the contact force exerted by each arm 50 against the adjacent contact pad 28 will be stable over an extended time period.

Housing 30 is advantageously molded of a plastic material which is relatively firm and strong and which has high temperature properties.

The features of the invention described thus far permit easy insertion of chip carrier 18 into recess 38 under zero insertion force or extremely low insertion force conditions coupled with precisely controlled contact forces at the electrical interface of terminals 8 and contact pads 28. The actual contact force exerted by terminals 8 on the contact pads 28 of the chip carrier 18 can furthermore be precisely controlled by changing the characteristics of camming surface 62 and/or the dimensions of housing 30. For example, if terminals 8 and contact pads 28 are tin plated so that a high contact force is required, the housing 30 can be designed such that it will produce the desired relatively high contact force. On the other hand, if the contact surfaces are all gold plated and it is desired to have a relatively lower contact force, this result can also be achieved. This feature of the invention is particularly desirable for burn-in type connectors since it permits testing of the chip carrier under precisely controlled conditions.

As housing 30 is lifted from the second position to the first position, section 74 moves terminals 8 back to the prestressed position, disengaging contact pads 28 of the chip carrier 18. This alleviates the restrictive force that terminals 8 apply on contact pads 28 freeing chip carrier 18 for removal from recess 38. As the action occurs, surfaces 68 of projections 70 engage bottom 24 of the chip carrier 18 forcing chip carrier 18 upward, out of recess 38, allowing for easy removal of chip carrier 18 from connector 2. This combination of motions enables for zero insertion force removal of chip carrier 18 from recess 38.

This type of connector is of particular convenience for use when burn-in type chip carrier connections are needed because it is desirable that the chip carrier be handled carefully when it is placed in and removed from the burn-in connector so that no damage will be done to the chip carrier and the contact pads on its surface. Also, it will be apparent that all of the movements illustrated in FIGS. 2 through 4, that is, the movement of the housing and chip carrier between the first and second position, permit the use of robotic apparatus in carrying out the testing process. A chip carrier being tested can therefore be placed in the connector by robotic insertion and can be removed thereafter in the same manner. As noted above, the contact force can be closely controlled by virtue of the camming surface of the housing so that the testing and burn-in process is carried out under precisely controlled conditions.

I claim:

1. A chip carrier connector for an integrated circuit chip carrier, comprising:

a housing having a rectangular recess therein which is dimensioned to receive the chip carrier, and a rectangular base having walls extending normally from edges of the rectangular base;

the walls defining the recess for the chip carrier, each of the walls having an internal surface which is opposed to a chip carrier side surface when a chip carrier is placed in the recess the internal surface having a camming surface located thereon, each of the walls having terminal-receiving cavities extending inwardly thereof from its internal surface;

electrical terminals positioned in the terminal-receiving cavities, the terminals being movable such that contact portions of the terminals are located in the cavities when the housing is in a first position and in the recess when the housing is in a second position;

the housing being movable with respect to the terminals, whereby as the chip carrier is inserted into the recess, the housing is positioned in the first position with the terminals completely in the cavities to allow for low insertion force of the carrier into the recess of the housing, as insertion continues the chip carrier contacts a surface of the housing causing the chip carrier and the housing to move to the second position, the second position being defined when a bottom surface of the housing contacts a circuit board, as this movement occurs the camming surfaces of the walls cooperate with the terminals to move the terminals against contact pads of the chip carrier, causing the terminals to create a wiping action on the contact pads, ensuring a positive electrical connection is effected between the terminals and the contact pads.

2. A chip carrier connector as recited in claim 1 wherein each terminal comprises a bight portion, arms extending from the bight portion, a neck which extends from the bight portion to a base, and a post which extends from the base.

3. A chip carrier connector as recited in claim 2 wherein the arms of each terminal comprise a front arm proximate the recess and a back arm proximate a respective wall of the housing.

4. A chip carrier connector as recited in claim 3 wherein the contact portion of the terminal is located on the front arm of the terminal.

5. A chip carrier connector as recited in claim 3 wherein the back arms are essentially straight with widened arcuate ends which cooperate with the camming surface of the walls to move the terminals.

6. A chip carrier connector as recited in claim 5 wherein the neck acts as a pivot, such that when the camming surfaces of the walls cooperate with the arcuate ends of the back arms, the terminals are permitted to move inward, causing the contact portions of the terminals to enter the recess, establishing electrical contact with contact pads of the chip carrier.

7. A chip carrier connector as recited in claim 3 wherein the front arm and the bight portion form a generally C-shaped member, a free end of the front arm being positioned proximate the back arm.

8. A chip carrier connector as recited in claim 7 wherein the front arm has a projection extending toward the recess, the projection cooperating with the base of the housing to prevent the housing from being raised further than the first position, the front arm also having a curved lower portion beneath the projection which cooperates with the base of the housing to prestress the front arm away from the recess when the housing is in the first position.

9. A chip carrier connector as recited in claim 1 wherein the bottom surface of the housing which contacts the circuit board is provided on a projection extending from the base of the housing.

10. A chip carrier connection as recited in claim 1 wherein the housing has projections extending into the recess, the projections provided to cooperate with the chip carrier such that as the housing is moved from the second position to the first position, the projections engage the chip carrier forcing the chip carriers out of the recess allowing for easy removal of the chip carrier from the chip carrier connector.

11. An electrical connector for an electrical component, comprising:
  housing means having recess means located therein and a base member having walls extending therefrom;
  the walls defining the recess means which is dimensioned to receive the electrical component therein, the walls having camming surfaces located thereon and terminal-receiving cavities extending inwardly therefrom;
  terminal means positioned in the terminal-receiving cavities, the terminal means being movable as the housing means is moved between a first position and a second position;
  the housing means being movable with respect to the terminal means, whereby as the electrical component is inserted into the recess means, the housing means is positioned in the first position with the terminal means completely in the cavities to allow for lower insertion force of the component into the recess means, as insertion continues the component contacts a surface of the housing means causing the component and housing means to move to the second position, as this movement occurs the camming surfaces of the walls cooperate with the terminal means to move the terminal means against the electrical components, causing the terminal means to create a wiping action on the components, ensuring that a positive electrical connection is effected between the terminal means and the component.

12. An electrical connector as recited in claim 11 wherein the electrical connector is a chip carrier socket.

13. An electrical connector as recited in claim 12 wherein the electrical component is a chip carrier.

14. An electrical connector as recited in claim 11 wherein the walls extend essentially perpendicular to the base member.

15. An electrical connector as recited in claim 11 wherein the component has contact pads which cooperate with the terminal means, the terminal means wipingly engaging the contact pads as the housing means is moved from the first position to the second position, thereby ensuring positive electrical connection.

16. An electrical connector as recited in claim 11 wherein means are provided to preload the terminal means, when the housing means is in the first position, thereby maintaining the terminal means in the terminal receiving cavity.

17. An electrical connector as recited in claim 12 wherein each terminal means comprises a bight portion, arms extending from the bight portion, a neck which extends from the bight portion to a base, and a post which extends from the base.

18. An electrical connector as recited in claim 17 wherein the arms of each terminal means comprise a front arm proximate the recess means and a back arm proximate a respective wall of the housing means, the front arm having a contact portion which cooperates with the electrical component to effect electrical contact therebetween, the back arm having a widened arcuate end which cooperates with the camming surface of a respective wall to move the terminal means.

19. An electrical connector as recited in claim 18 wherein the neck acts as a pivot, such that when the camming surfaces of the walls cooperate with the arcuate ends of the back arms, the terminal means are permitted to move inward, causing the contact portions of the terminal means to enter the recess means, establishing electrical contact with the electrical component.

20. An electrical connector as recited in claim 11 wherein ejection means are provided such that as the housing means is moved from the second position to the first position, the electrical component is removed from the recess means of the electrical connector under zero removal force conditions.

* * * * *